US009714982B2

(12) United States Patent
Tsuzuku et al.

(10) Patent No.: US 9,714,982 B2
(45) Date of Patent: Jul. 25, 2017

(54) METHOD AND DEVICE FOR ESTIMATING REMAINING CAPACITY OF BATTERY

(71) Applicant: KABUSHIKI KAISHA TOYOTA JIDOSHOKKI, Aichi (JP)

(72) Inventors: Takahiro Tsuzuku, Kariya (JP); Hiroyuki Nomura, Kariya (JP); Kenji Nishigaki, Kariya (JP); Masashi Kidono, Kariya (JP)

(73) Assignee: KABUSHIKI KAISHA TOYOTA JIDOSHOKKI, Aichi (JP)

( * ) Notice: Subject to any disclaimer, the term of this patent is extended or adjusted under 35 U.S.C. 154(b) by 100 days.

(21) Appl. No.: 14/765,607

(22) PCT Filed: Nov. 5, 2013

(86) PCT No.: PCT/JP2013/079893
§ 371 (c)(1),
(2) Date: Aug. 4, 2015

(87) PCT Pub. No.: WO2014/132491
PCT Pub. Date: Sep. 4, 2014

(65) Prior Publication Data
US 2015/0369869 A1 Dec. 24, 2015

(30) Foreign Application Priority Data
Feb. 27, 2013 (JP) .................................. 2013-036613

(51) Int. Cl.
*H02J 7/00* (2006.01)
*G01R 31/36* (2006.01)
(Continued)

(52) U.S. Cl.
CPC ......... *G01R 31/3606* (2013.01); *G01R 31/36* (2013.01); *G01R 31/362* (2013.01);
(Continued)

(58) Field of Classification Search
CPC ........ H02J 7/00; G01R 31/3606; H01M 10/44
(Continued)

(56) References Cited

U.S. PATENT DOCUMENTS 6,232,744 B1 5/2001 Kawai et al.
2012/0293131 A1* 11/2012 Nakamura ........... G01R 31/361
320/134

FOREIGN PATENT DOCUMENTS

JP 2000-078757 3/2000
JP 2000-312404 11/2000
(Continued)

OTHER PUBLICATIONS

Machine translation of JP 2000-312404A. Kobayashi, Tetsuya et al., Method of Controlling a Battery of a Power Generating Electric Vehicle, Nov. 7, 2000.*
(Continued)

*Primary Examiner* — Edward Tso
*Assistant Examiner* — Aaron Piggush
(74) *Attorney, Agent, or Firm* — Greenblum & Bernstein, P.L.C.

(57) ABSTRACT

A method and a device are provided for estimating a remaining capacity of a battery. Transient characteristics are generated that represent a correlation between the remaining capacity and a closed circuit voltage, the correlation transitioning from one of a charging-side and a discharging-side characteristic to the other when the charging/discharging of the battery has been switched, on the basis of map data of a charging-side characteristic that is only conducted from a fully-discharged to a fully-charged state and a discharging-side characteristic that is only conducted from the fully-charged to the fully-discharged state, the characteristics representing a correlation between the remaining capacity and the Closed Circuit Voltage of the battery. When charging
(Continued)

and discharging of the battery have been switched, the remaining capacity of the battery is estimated from the Closed Circuit Voltage of the battery by using the transient characteristics until polarization of the battery enters a saturated state.

8 Claims, 9 Drawing Sheets

(51) Int. Cl.
  *H01M 10/44* (2006.01)
  *H01M 10/48* (2006.01)
(52) U.S. Cl.
  CPC ........... *H01M 10/44* (2013.01); *H01M 10/48* (2013.01); *H02J 7/00* (2013.01); *H02J 7/007* (2013.01); *H02J 7/0047* (2013.01); *H02J 2007/005* (2013.01)
(58) Field of Classification Search
  USPC .................................. 324/427; 320/132, 134
  See application file for complete search history.

(56) References Cited

FOREIGN PATENT DOCUMENTS

| | | |
|---|---|---|
| JP | 2003-168489 | 6/2003 |
| JP | 2012-247374 | 12/2012 |

OTHER PUBLICATIONS

U.S. Appl. No. 14/760,830 to Kenji Nishigaki et al., filed Jul. 14, 2015.

U.S. Appl. No. 14/766,538 to Kenji Nishigaki et al., filed Aug. 7, 2015.

International Search Report (ISR) in International Pat. Appl. No. PCT/JP2013/079893, dated Feb. 18, 2014.

Office Action from Japan Patent Office (JPO) in Japanese Patent Application No. 2013-036613, dated Jan. 5, 2016, together with an English language translation.

* cited by examiner

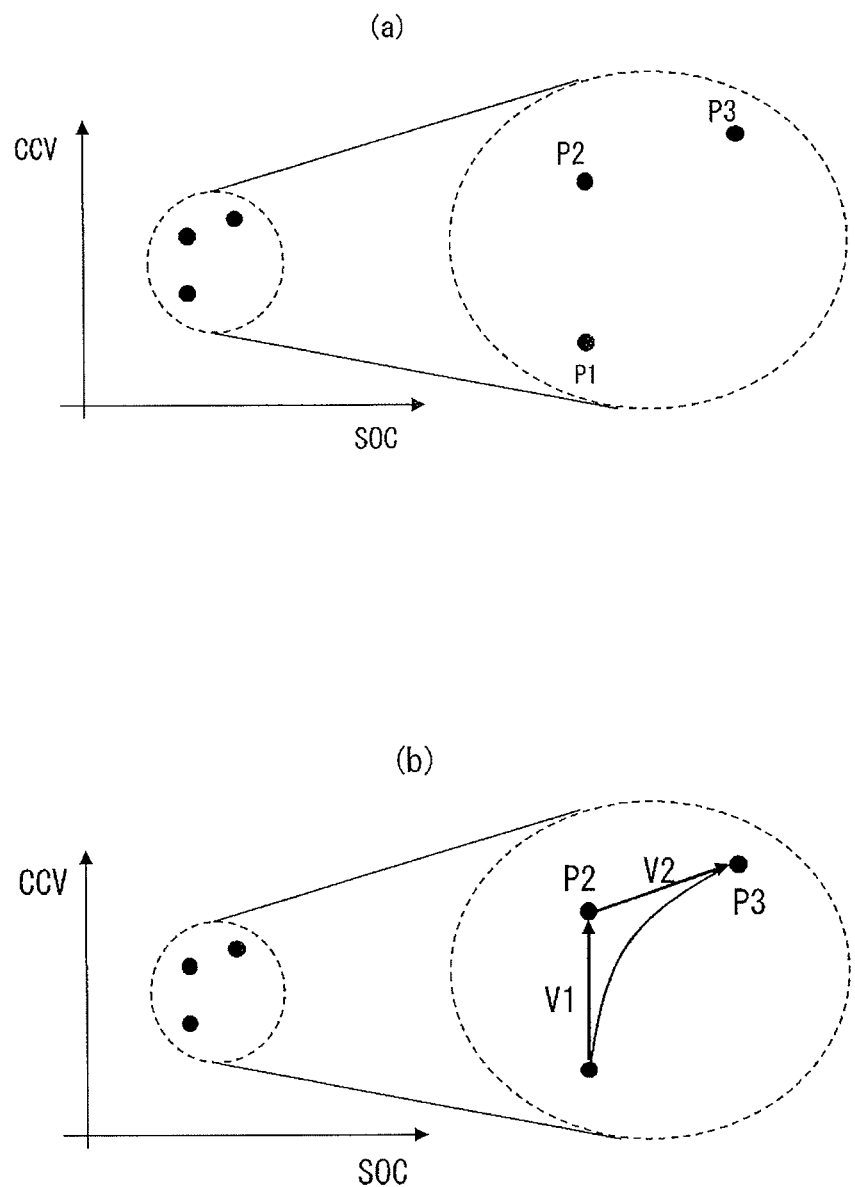
F I G. 4

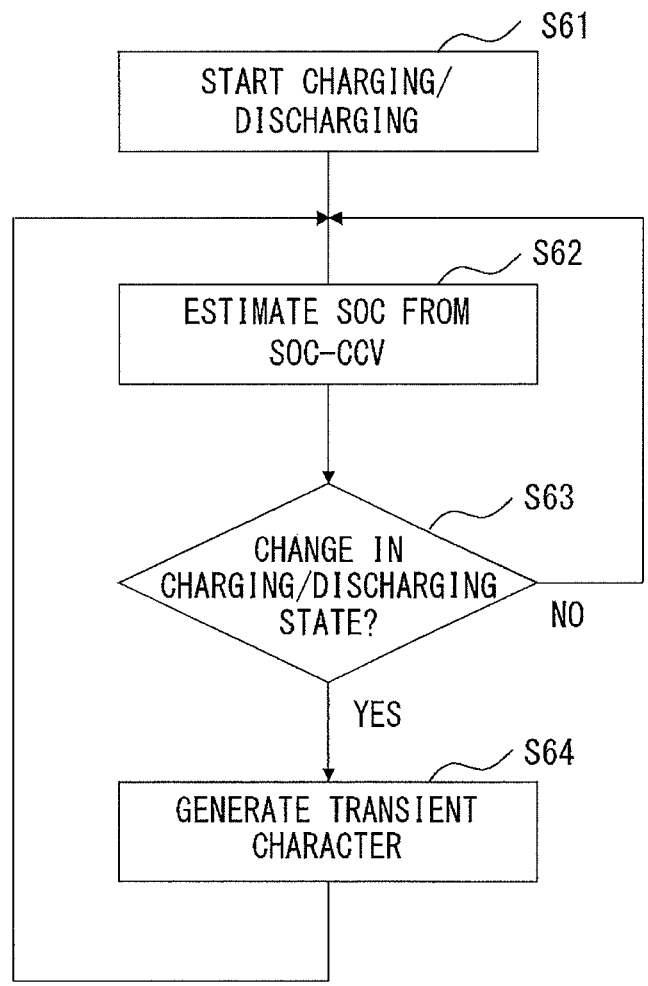
F I G. 6

METHOD AND DEVICE FOR ESTIMATING REMAINING CAPACITY OF BATTERY

TECHNICAL FIELD

The present invention is related to a method and device for estimating the remaining capacity of a secondary battery such as a lithium-ion battery, a nickel-hydrogen battery, etc.

BACKGROUND ART

The remaining capacity of a battery can be estimated on the basis of the SOC (State Of Charge), which is the ratio of the remaining charge amount to the fully charged state of the battery. The State Of Charge (SOC) is also referred to as a charge state and is also referred to as a remaining capacity (SOC).

Generally, in the estimation of a remaining capacity (SOC) of a lithium-ion battery, a nickel-hydrogen battery, etc., the Open Circuit Voltage (OCV) is estimated from the Closed Circuit Voltage (CCV). Thereafter, by referring to map data of the SOC-OCV characteristic, which results from associating the remaining capacity (SOC) with the Open Circuit Voltage (OCV), the remaining capacity (SOC) is estimated from the Open Circuit Voltage (OCV).

When the SOC-OCV characteristic is obtained, the value of the Open Circuit Voltage (OCV) of the battery is obtained from for example the voltage value of the battery at a time point when three hours have elapsed after halting the power supply at the temperature of twenty five degrees. However, because a lithium-ion battery etc. that uses an SiO negative electrode does not have the polarization resolved completely even three hours after the halt of the power supply, the obtained value is not an accurate Open Circuit Voltage (OCV).

Accordingly, in a battery in which the polarization is of a large scale and it takes a long time to resolve it, a charging-side SOC-OCV characteristic 81, which is measured during charging, and a discharging-side SOC-OCV characteristic 82, which is measured during discharging, greatly differ from each other in hysteresis, making it difficult to estimate the remaining capacity (SOC) from the Open Circuit Voltage (OCV) in a manner shown in FIG. 8.

Against this background, the estimation of a remaining capacity (SOC) on the basis of an SOC-CCV characteristic resulting from associating the Closed Circuit Voltage (CCV) with the remaining capacity (SOC) is being discussed. Although SOC-CCV characteristics differ between when the battery is being charged and when the battery is being discharged, Patent document 1 below and other documents describe a technique of estimating a remaining capacity (SOC) by using the SOC-CCV characteristic.

Patent Document 1 describes a charge state management device, for a battery that is charged and discharged repeatedly and randomly, that refers to the SOC-CCV characteristic on the basis of the battery voltage during discharging so as to obtain the remaining capacity $SOC_x$, and outputs the remaining capacity $SOC_x$ as the current remaining capacity SOC when the remaining capacity $SOC_x$ is smaller than a minimum remaining capacity $SOC_{min}$ stored in the storage unit in order to update the minimum remaining capacity $SOC_{min}$ by referring to the remaining capacity SOC.

CITATION LIST

Patent Literature

Patent Document 1: Japanese Laid-open Patent Publication No. 2000-078757

SUMMARY OF INVENTION

Technical Problem

FIG. 9(a) shows an example of an SOC-CCV characteristic resulting from associating a Closed Circuit Voltage (CCV) with a remaining capacity (SOC). In FIG. 9(a), the charging-side SOC-CCV characteristic measured during charging is denoted by "91" while the discharging-side SOC-CCV characteristic measured during discharging is denoted by "92".

In a case when the battery is only discharged from the fully-charged state so as to use the entire capacity in the estimation of the remaining capacity (SOC) on the basis of the SOC-CCV characteristic, it is possible to estimate the remaining capacity (SOC) in the middle of the discharging by referring to the discharging-side SOC-CCV characteristic 92 from the Closed Circuit Voltage (CCV) in the middle of the discharging.

Also, in a case when the battery is only charged from the fully-discharged state so as to bring the battery to the fully-charged state, it is possible to estimate the remaining capacity (SOC) in the middle of the charging by referring to the charging-side SOC-CCV characteristic 91 from the Closed Circuit Voltage (CCV) in the middle of the charging.

As shown in FIG. 9(b), however, it has been confirmed by experiment that the correspondence between the remaining capacity (SOC) and the Closed Circuit Voltage (CCV) transitions along a transient curve 93 from the discharging-side SOC-CCV characteristic 92 to the charging-side SOC-CCV characteristic 91 when charging has been started in the middle of discharging before the battery enters the fully-discharged state.

It has also been confirmed by experiment that the correspondence between the remaining capacity (SOC) and the Closed Circuit Voltage (CCV) transitions along a transient curve 94 from the charging-side SOC-CCV characteristic 91 to the discharging-side SOC-CCV characteristic 92 when discharging has been started in the middle of charging and before the battery enters the fully-charged state.

Accordingly, when charging has been started in the middle of discharging and before the battery enters the fully-discharged state or when discharging has been started in the middle of charging before the battery enters the fully-charged state, the correspondence between the remaining capacity (SOC) and the Closed Circuit Voltage (CCV) applies to neither the charging-side SOC-CCV characteristic 91 nor the discharging-side SOC-CCV characteristic 92, leading to the problem of deteriorated accuracy in the estimation of the remaining capacity (SOC).

In view of the above problem, the present invention provides a method and device for estimating a remaining capacity of a battery, for a battery in which the polarization is of a large scale and in which it takes a long time to resolve it, that realizes a highly accurate estimation of a remaining capacity (SOC) of a battery from the Closed Circuit Voltage (CCV) of the battery even when charging has been started in the middle of discharging before the battery enters the fully-discharged state or when discharging has been started in the middle of charging before the battery enters the fully-charged state.

Solution to Problem

A method for estimating a remaining capacity of a battery according to the present invention is a method including generating a transient characteristic that represents a correlation between a remaining capacity (SOC) and a Closed Circuit Voltage (CCV), the correlation transitioning from one of a charging-side SOC-CCV characteristic and a discharging-side SOC-CCV characteristic to the other when charging and discharging of the battery have been switched, on the basis of map data of a charging-side SOC-CCV characteristic that represents a correlation between a remaining capacity (SOC) of the battery and a Closed Circuit Voltage (CCV) of the battery in a case when charging has only been conducted from a fully-discharged state to a fully-charged state and of a discharging-side SOC-CCV characteristic that represents a correlation between a remaining capacity (SOC) of the battery and a Closed Circuit Voltage (CCV) of the battery in a case when discharging has only been conducted from a fully-charged state to a fully-discharged state, and estimating the remaining capacity (SOC) of the battery from the Closed Circuit Voltage (CCV) by using the transient characteristic until polarization of the battery enters a saturated state when charging and discharging of the battery have been switched.

Also, a device for estimating a remaining capacity of a battery according to the present invention is a device including an SOC-CCV map data storage unit that has stored SOC-CCV map data of a charging-side SOC-CCV characteristic that represents a correlation between a remaining capacity (SOC) of the battery and a Closed Circuit Voltage (CCV) of the battery in a case when charging has only been conducted from a fully-discharged state to a fully-charged state and of a discharging-side SOC-CCV characteristic that represents a correlation between a remaining capacity (SOC) of the battery and a Closed Circuit Voltage (CCV) of the battery in a case when discharging has only been conducted from a fully-charged state to a fully-discharged state, a transient characteristic generating unit configured to generate a transient characteristic that represents a correlation between a remaining capacity (SOC) and a Closed Circuit Voltage (CCV), the correlation transitioning from one of a charging-side SOC-CCV characteristic and a discharging-side SOC-CCV characteristic to the other on the basis of the SOC-CCV map data when charging and discharging of the battery have been switched, and a remaining capacity (SOC) estimation unit configured to estimate the remaining capacity (SOC) of the battery from the closed circuit voltage (CCV) by using the transient characteristic until polarization of the battery enters a saturated state when charging and discharging of the battery have been switched.

Advantageous Effects of Invention

According to the present invention, for a battery in which the polarization is of a large scale and it takes a long time to resolve it, it is possible to highly accurately estimate the remaining capacity (SOC) of a battery from the Closed Circuit Voltage (CCV) of the battery even when charging has been started in the middle of discharging before the battery enters the fully-discharged state or when discharging has been started in the middle of charging before the battery enters the fully-charged state.

BRIEF DESCRIPTION OF DRAWINGS

FIG. 4 explain a specific method of generating a curve of a transient characteristic;

FIG. 6 shows a flow of an operation example of estimating of the remaining capacity of a battery;

DESCRIPTION OF EMBODIMENTS

The present invention generates, as a transient characteristic, a new SOC-CCV characteristic representing the correlation between the remaining capacity (SOC) and the Closed Circuit Voltage (CCV), the correlation transitioning from a point on one of the curves of the charging-side SOC-CCV characteristic 91 and the discharging-side SOC-CCV characteristic 92 to a point on the other of those curves when switching has occurred between the charging and the discharging of the battery so as to use the transient characteristic for the estimation of the remaining capacity (SOC).

Figure 1:
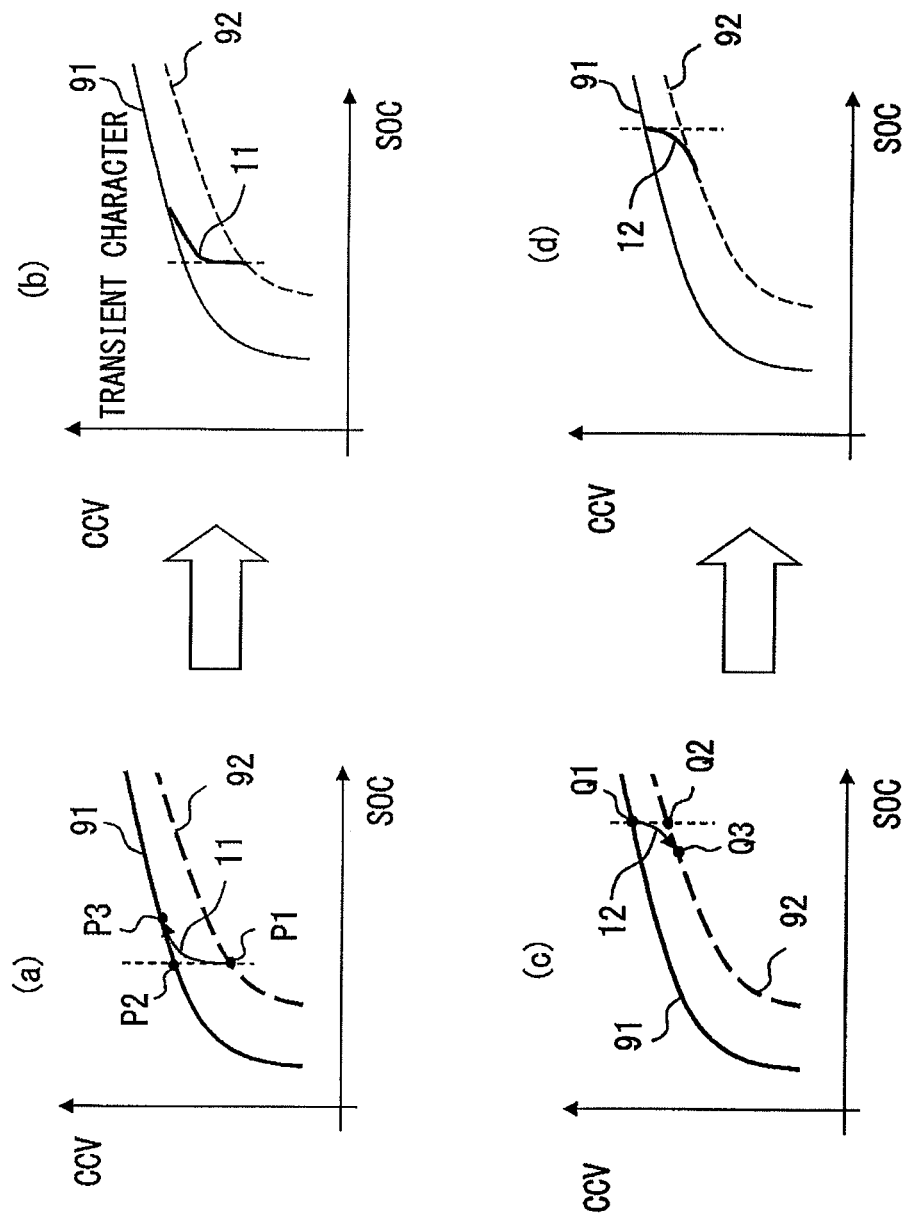
FIG. 1 shows an example of generating of a transient characteristic in a case when switching has occurred between charging and discharging.

FIG. 1 shows an example of generating of a transient characteristic in a case when switching has occurred between charging and discharging. The data of the charging-side SOC-CCV characteristic 91 shown in FIG. 1 is obtained by measuring the remaining capacity (SOC) while only conducting charging by flowing a prescribed current by using a charger in advance, and map data resulting from associating the remaining capacity (SOC) with the Closed Circuit Voltage (CCV) is stored in a storage unit (not shown).

Also, the data of the discharging-side SOC-CCV characteristic 92 is obtained by measuring the remaining capacity (SOC) while only conducting discharging in a typical usage pattern of the battery or at a discharging rate in a typical usage pattern of the battery, and map data resulting from associating the remaining capacity (SOC) with the Closed Circuit Voltage (CCV) is stored in the storage unit (not shown).

When charging has been started after discharging was halted in the middle of the discharging, a new SOC-CCV characteristic is generated as a transient characteristic 11 that rises vertically from point P1 on the discharging-side SOC-CCV characteristic 92 at the time when the discharging was halted in the middle of the discharging, toward point P2 on the curve of the charging-side SOC-CCV characteristic 91 with the same remaining capacity (SOC) as point P1 and that smoothly contacts the curve of the charging-side SOC-CCV characteristic 91 at point P3, at which the polarization of the battery reverses and enters the saturated state, as shown in FIG. 1(a).

FIG. 1(b) shows an example of the transient characteristic 11 that was newly generated. When charging has been started after discharging was halted in the middle of the discharging, the transient characteristic 11 is used until the polarization of the battery reverses and enters the saturated state, and the charging-side SOC-CCV characteristic 91 is used so as to estimate the remaining capacity (SOC) of the battery from the Closed Circuit Voltage (CCV) after the polarization has entered the saturated state. Note that cases where charging is started in the middle of discharging include a case of charging by using regenerative currents generated when a train vehicle decelerates as well as charging by using an external charger device.

When discharging has been started after charging was halted in the middle of the charging, a new SOC-CCV characteristic is generated, as a transient characteristic 12, that drops vertically from point Q1 on the charging-side SOC-CCV characteristic 91 at the time when the charging was halted in the middle of the charging, toward point Q2 on the curve of the discharging-side SOC-CCV characteristic 92 with the same remaining capacity (SOC) as point Q1 and that smoothly contacts the discharging-side SOC-CCV characteristic 92 at point Q3, at which the polarization of the battery reverses and enters the saturated state, as shown in FIG. 1(c).

FIG. 1(d) shows an example of the transient characteristic 12 that was newly generated. When discharging has been started after charging was halted in the middle of the charging, the transient characteristic 12 is used until the polarization of the battery reverses and enters the saturated state, and the discharging-side SOC-CCV characteristic 92 is used so as to estimate the remaining capacity (SOC) of the battery from the Closed Circuit Voltage (CCV) after the polarization has entered the saturated state. Note that cases where charging is halted and discharging is started include a case of halting of charging that uses regenerative currents generated when a train vehicle decelerates as well as halting of charging that uses an external charger device.

Figure 2:
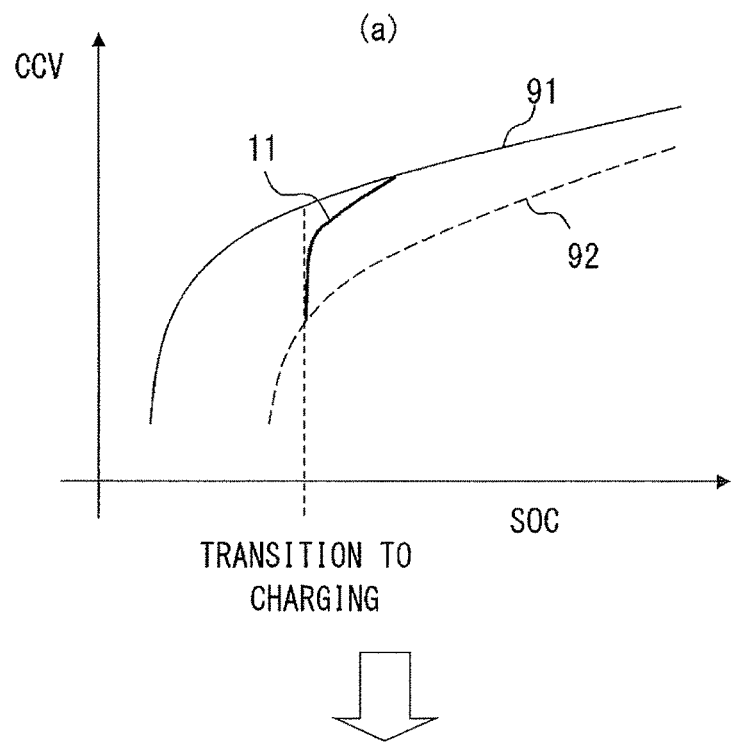
FIG. 2 show an example of generating of a transient characteristic in a case when switching has occurred between charging and discharging before the polarization saturates.
Figure 2:
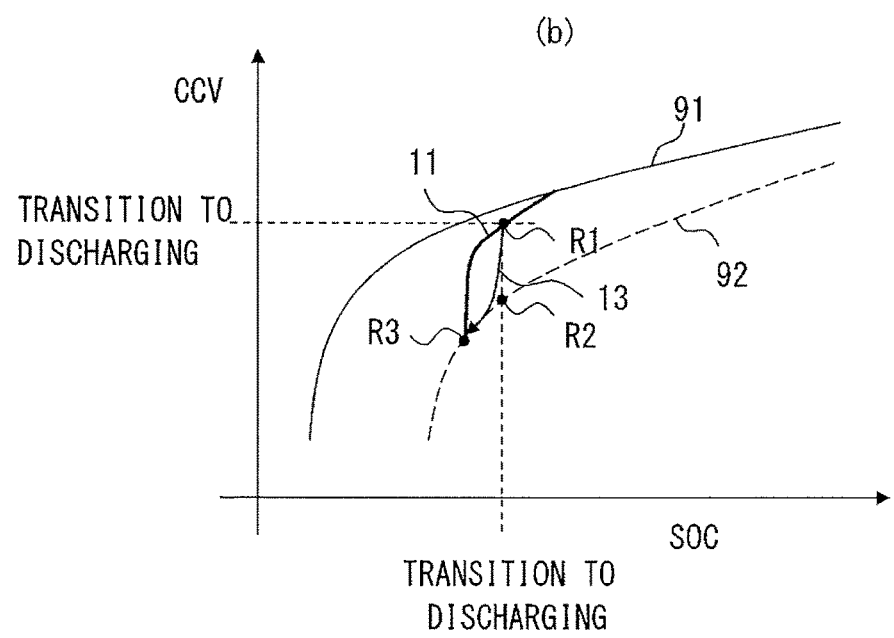

FIG. 2 show an example of the generating of a transient characteristic in a case when switching has occurred between charging and discharging before the polarization saturates. FIG. 2(a) shows the transient characteristic 11 (FIG. 1) generated when discharging was halted in the middle of the discharging and charging has been started. In a case when discharging has been started in the transient period after the start of the charging and before the entering of the polarization of the battery to the saturated state, a new SOC-CCV characteristic is generated, as a transient characteristic 13, that drops vertically from point R1 on the curve of the transient characteristic 11 at the time when the discharging was started, toward point R2 on the curve of the discharging-side SOC-CCV characteristic 92 with the same remaining capacity (SOC) as point R1 and that smoothly contacts the discharging-side SOC-CCV characteristic 92 at point R3, at which the polarization of the battery reverses and enters the saturated state, as shown in FIG. 2(b).

Generating a smooth curve along the actually measured data as a curve of a transient characteristic makes it possible to further improve the accuracy of the estimation of a remaining capacity (SOC). However, the generating of such a curve requires actually-measured data obtained under various conditions, making the generating of a curve of a transient characteristic complicated. Accordingly, in some cases, depending upon the complexity of the generating of a curve of a transient characteristic and the required accuracy of a remaining capacity (SOC), it is also possible to generate a curve of a transient characteristic on the basis of various pseudo curves obtained through the approximation of a straight line, a quadratic function, etc.

Figure 3:
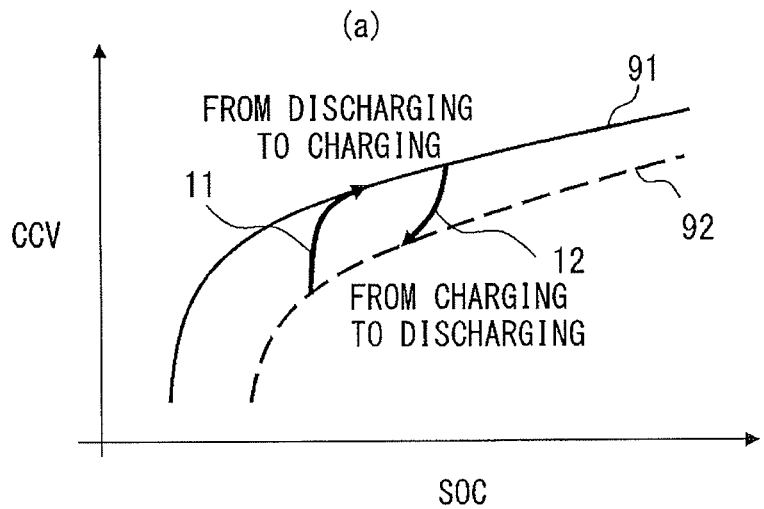
FIG. 3 explain a specific method of generating a curve of a transient characteristic.
Figure 3:
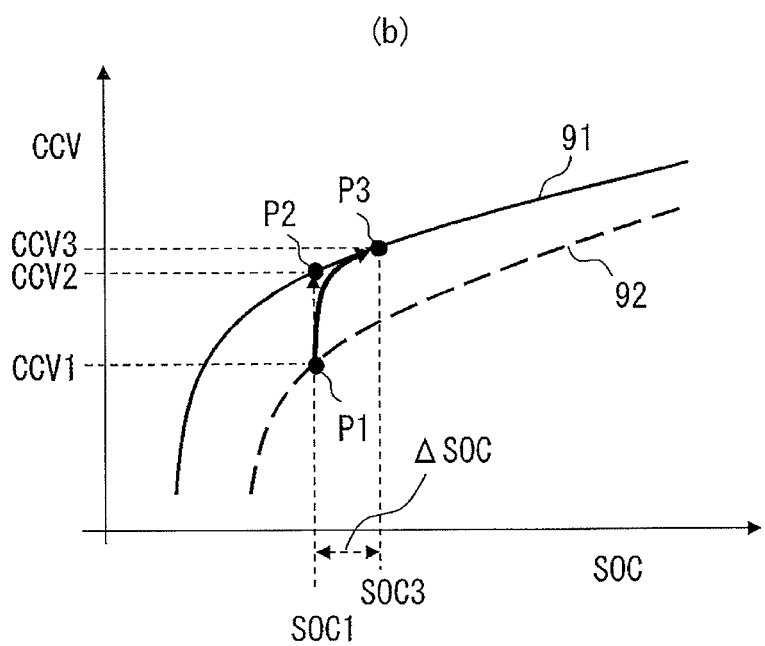
Figure 5:
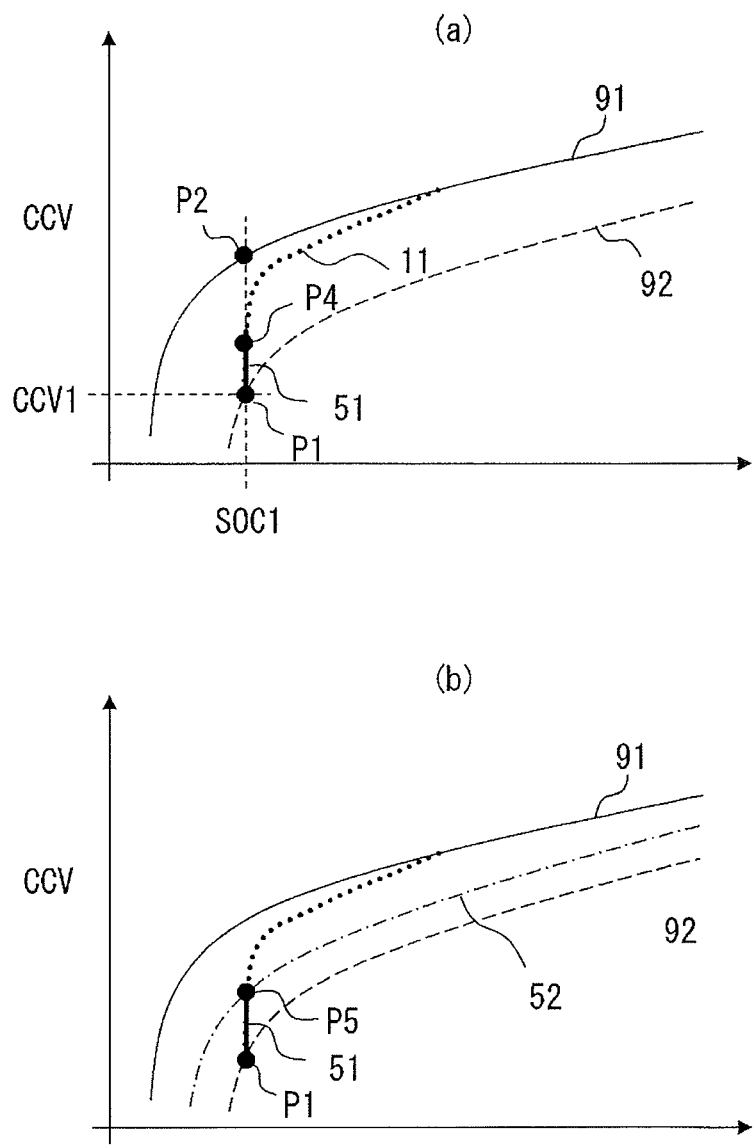
FIG. 5 explain a specific method of generating a curve of a transient characteristic.

Here, explanations will be given for a specific method of generating a curve of a transient characteristic by referring to FIG. 3 through FIGS. 5. While the transient characteristic 11, which is of a case when the operation has been switched to charging during discharging, and the transient characteristic 12, which is of a case when the operation has been switched to discharging during charging, exit as transient characteristics as shown in FIG. 3(a), the explanations will be given for the generating of the transient characteristic 11, which is of a case when the operation has been switched to charging during discharging. The transient characteristic 12, which is of a case when the operation has been switched to discharging during charging, can also be generated by using a similar method.

It is now assumed as shown in FIG. 3 (b) that charging has been started at point P1 on the curve of the discharging-side SOC-CCV characteristic 92, with remaining capacity SOC1 and Closed Circuit Voltage CCV1. The data used for generating transient characteristic at this moment is remaining capacity SOC1, Closed Circuit Voltage CCV1, and charging-side SOC-CCV characteristic 91 at the start of the charging.

First, point P2 (SOC1, CCV2) on the charging-side SOC-CCV characteristic 91 is identified by using the same remaining capacity SOC1 as P1 (SOC1, CCV1) on the curve of the discharging-side SOC-CCV characteristic 92 immediately before the start of the charging.

Next, remaining capacity SOC3 (=SOC1+ΔSOC) is obtained by adding, to remaining capacity SOC1 immediately before the start of the charging, amount of change ΔSOC in the remaining capacity required to enter the saturated state after the reverse of the polarization. Amount of change ΔSOC in the remaining capacity required to enter the saturated state after the reverse of the polarization is stored in a storage unit in advance as polarization reverse amount of change map data by measuring the amount and associating the measurement result with remaining capacity SOC at the time of the switching between charging and discharging. Next, point P3 (SOC3, CCV3) of remaining capacity SOC3 on the curve of the charging-side SOC-CCV characteristic 91 is identified.

In the above method, as shown in FIG. 4(a), three points P1 through P3 are identified on the plane with the horizontal and vertical axes representing SOC and CCV, respectively. A curve of a transient characteristic that transitions from those three points to points P1 through P3 is generated. As shown in FIG. 4(b), the curve of the transient characteristic is generated in such a manner that the curve is a smooth curve that is directed, at point P1, in the direction of vector V1, which is directed from point P1 to point P2, and is directed, at point P3, in the direction of vector V2, which is directed from point P2 to point P3.

A method of generating for example a B-spline curve or a Bézier curve may also be used for the generating of the above curve. It is also possible to generate a curve that is pseudo and simpler and to use a pseudo curve that does not completely correspond to the direction of vector V1 or V2 at point P1 or P3 in order to reduce the process loads.

Further, in generating of a transient characteristic, a transient characteristic is generated by taking into consideration the effect of a voltage drop or a voltage rise caused by the internal resistance of the battery in addition to the effect of the polarization caused by the chemical reactions in the battery. The internal resistance of the battery can be obtained from the battery specification or by measuring the voltage and current during the charging/discharging. The voltage drop or the voltage rise caused by the internal resistance does not have a relationship with the remaining capacity (SOC), and accordingly it is represented by a vertical straight line 51 in view of the transient characteristic, as shown in FIG. 5(a).

Accordingly, a transient characteristic obtained with the effects of the internal resistance taken into consideration is generated as a characteristic that is linear from point P1 to point P4, point P1 being of remaining capacity SOC1 and Closed Circuit Voltage CCV1 immediately before the switching between charging and discharging and point P4 being a point having the same remaining capacity SOC1 as P1 and being between points P1 and P2 above.

Further, as shown in FIG. 5(b), it is possible to assume, as point P4 described above, point P5 on an SOC-OCV characteristic 52 representing a correlation between the remaining capacity (SOC) of a battery and the Open Circuit Voltage (OCV) of the battery. When the battery has been left as it is for a while after the discharging has been halted at point P1, the voltage of the battery becomes closer to the Open Circuit Voltage (OCV).

When charging or discharging is not conducted and the battery is left as it is, there is no change in the remaining capacity (SOC). Accordingly, curves of transient characteristics are generated so that the line is a straight line rising vertically from point P1 at least up to point P5, at which the battery voltage is equal to the Open Circuit Voltage (OCV). Thereby, a transient characteristic is generated that makes it possible to estimate the remaining capacity (SOC) highly accurately even when charging was conducted after the battery was left as it is for a while after the discharging was halted.

FIG. 6 shows a flow of an operation example of the estimation of the remaining capacity of a battery according to the present invention. As shown in FIG. 6, when the charging/discharging/has been started (step S61), the remaining capacity (SOC) is estimated by referring to an SOC-CCV characteristic from the measured value of the Closed Circuit Voltage (CCV) of the battery (step S62).

Then, it is determined whether or not there was a change in the charging/discharging state from charging to discharging or from discharging to charging (step S63), and when there was change in the charging/discharging state (in the case of Yes), a transient characteristic is generated by using the above method (step S64). After the generating of a transient characteristic, the process returns to step S62, and repeats a similar operation flow. Also, when it has been determined that there was not change in the charging/discharging state (step S63: in the case of No), the process returns to step S62 and repeats a similar operation flow.

Figure 7:
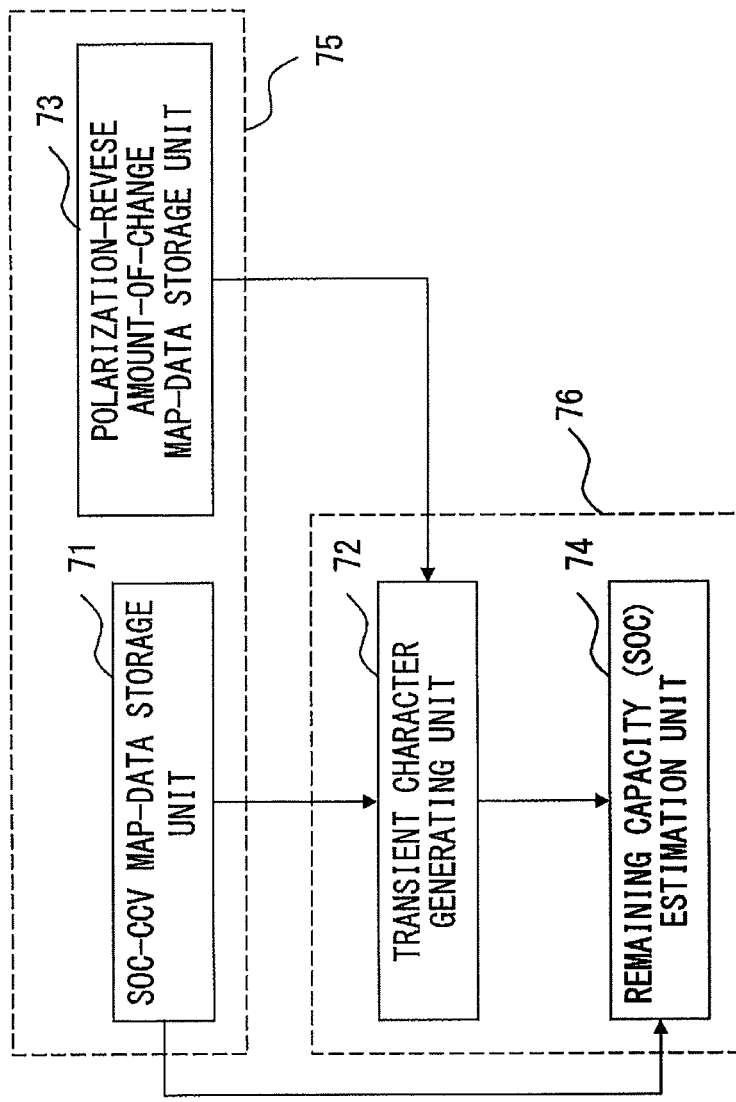
FIG. 7 shows a configuration example of a functional block of a device for estimating the remaining capacity of a battery.
Figure 8:
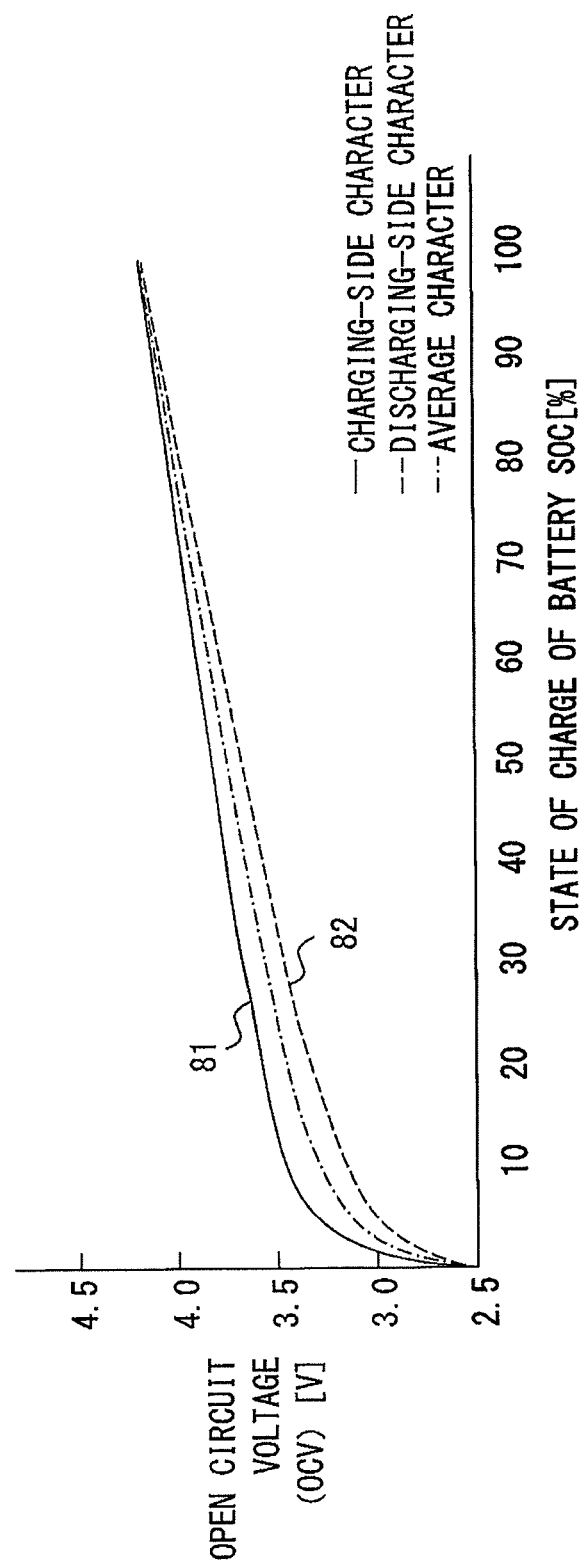
FIG. 8 shows a charging-side SOC-OCV characteristic and a discharging-side SOC-OCV characteristic.
Figure 9:
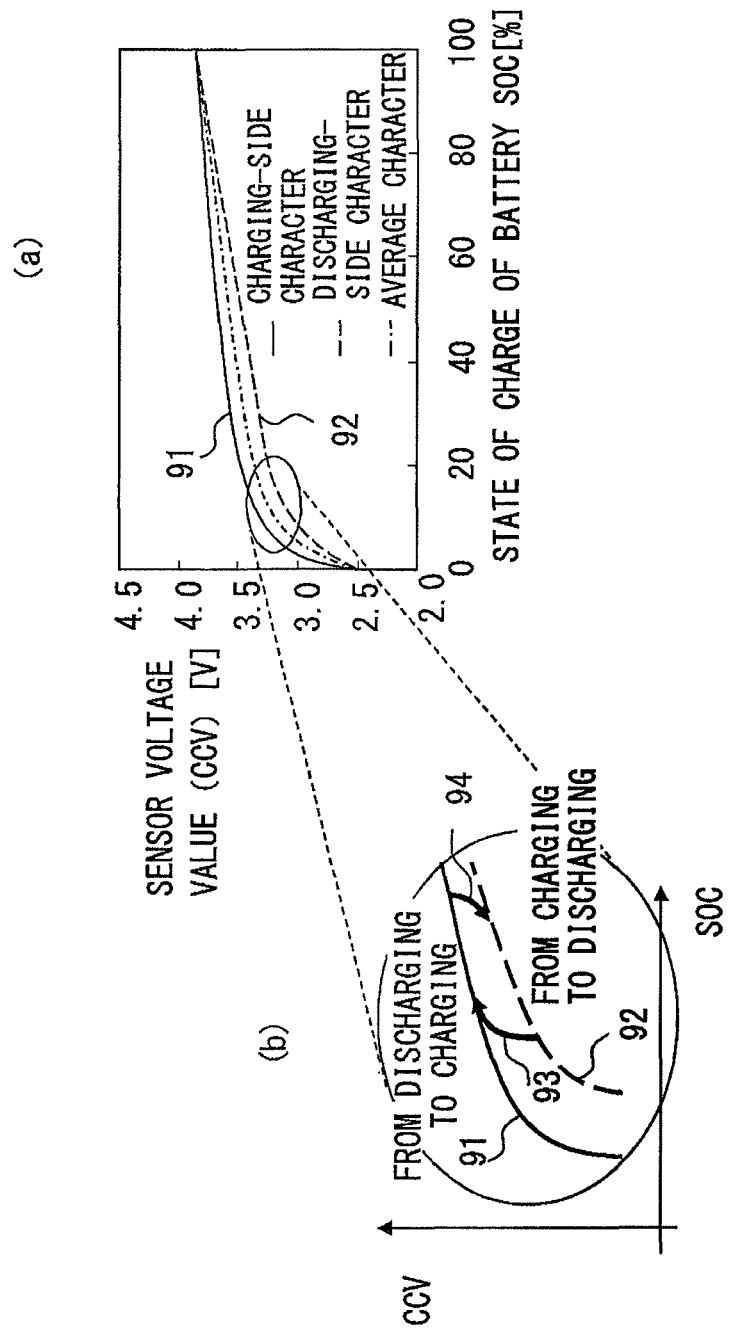
FIG. 9 shows a charging-side SOC-CCV characteristic and a discharging-side SOC-CCV characteristic.

FIG. 7 shows a configuration example of a functional block of a device for estimating the remaining capacity of a battery according to the present invention. A device for estimating the remaining capacity of a battery according to the present invention includes an SOC-CCV map-data storage unit 71, a transient characteristic generating unit 72, a polarization-reverse amount-of-change map-data storage unit 73, and a remaining capacity (SOC) estimation unit 74.

The SOC-CCV map-data storage unit 71 stores map data of a charging-side SOC-CCV characteristic representing a correlation between the remaining capacity (SOC) of a battery and the Closed Circuit Voltage (CCV) of the battery in a case when charging has only been conducted from the fully-discharged state to the fully-charged state.

Also, the SOC-CCV map-data storage unit 71 stores map data of a discharging-side SOC-CCV characteristic representing a correlation between the remaining capacity (SOC) of a battery and the Closed Circuit Voltage (CCV) of the battery in a case when discharging has only been conducted from the fully-charged state to the fully-discharged state.

Also, the SOC-CCV map-data storage unit 71 stores map data of an SOC-OCV characteristic representing a correlation between the remaining capacity (SOC) of a battery and the Open Circuit Voltage (OCV) of the battery.

The polarization-reverse amount-of-change map-data storage unit 73 stores a map table that has associated the amount of change in the remaining capacity (SOC) necessary for the change in the charging/discharging state and for the polarization to reverse to enter the saturated state with the remaining capacity (SOC) at the time of a change in the charging/discharging state.

The transient characteristic generating unit 72 refers to data stored in the polarization-reverse amount-of-change map-data storage unit 73 from the remaining capacity (SOC) at the time of a change in the charging/discharging state so as to identify the amount of change in the remaining capacity (SOC) necessary for the polarization to reverse to enter the saturated state.

When switching has occurred between the charging and the discharging of a battery so as to cause a change in the charging/discharging state, the transient characteristic generating unit 72 uses the above method to refer to the SOC-CCV map-data storage unit 71 and the polarization-reverse amount-of-change map-data storage unit 73 and generates a curve of a transient characteristic that represents a correlation between the remaining capacity (SOC) and the Closed Circuit Voltage (CCV), the curve transitioning from one of the discharging-side SOC-CCV characteristic and the charging-side SOC-CCV characteristic to the other.

When the charging/discharging state has changed, the remaining capacity (SOC) estimation unit 74 estimates the remaining capacity (SOC) of the battery from the Closed Circuit Voltage (CCV) by using the transient characteristic generated by the transient characteristic generating unit 72 until the polarization reverses and enters the saturated state. After the polarization has entered the saturated state, the remaining capacity (SOC) estimation unit 74 estimates the remaining capacity (SOC) of the battery from the Closed Circuit Voltage (CCV) by using the charging-side SOC-CCV characteristic or the discharging-side SOC-CCV characteristic.

The SOC-CCV map-data storage unit 71 and the polarization-reverse amount-of-change map-data storage unit 73 can be configured by using various types of storage units 75 based on a magnetic memory, a semiconductor memory, etc. Also, the transient characteristic generating unit 72 and the remaining capacity (SOC) estimation unit 74 can be configured by using a control device 76 based on a processor that can conduct various types of arithmetic operations using a program, a programmable logic device, etc.

Although the embodiments of the present invention have been explained above, the scope of the present invention is not limited to the above embodiments, and various configurations or embodiments can be employed without departing from the spirit of the present invention.

EXPLANATION OF THE CODES 11, 12, 13 transient characteristic
51 vertical straight line 52 SOC-OCV characteristic
71 SOC-CCV map-data storage unit
72 transient characteristic generating unit
73 polarization-reverse amount-of-change map-data storage unit
74 remaining capacity (SOC) estimation unit
75 storage unit
76 control device
81 charging-side SOC-OCV characteristic
82 discharging-side SOC-OCV characteristic
91 charging-side SOC-CCV characteristic
92 discharging-side SOC-CCV characteristic
93, 94 transient curve

The invention claimed is:

1. A method for estimating a remaining capacity of a battery, the method comprising:
generating a transient characteristic that represents a correlation between a remaining capacity and a closed circuit voltage, the correlation transitioning from one of a charging-side SOC-CCV characteristic and a discharging-side SOC-CCV characteristic to the other when charging and discharging of the battery have been switched, on the basis of map data of a charging-side SOC -CCV characteristic that represents a correlation between a remaining capacity (SOC) of the battery and a Closed Circuit Voltage (CCV) of the battery when charging has only been conducted from a fully-discharged state to a fully-charged state and of a discharging-side SOC-CCV characteristic that represents a correlation between a remaining capacity of the battery and a closed circuit voltage of the battery when discharging has only been conducted from a fully-charged state to a fully-discharged state; and
estimating the remaining capacity of the battery from the closed circuit voltage by using the transient characteristic until polarization of the battery enters a saturated state when charging and discharging of the battery have been switched, wherein the generating comprises generating a transient characteristic that contacts, at a third point, which is a point that has moved from a first point of a remaining capacity and a closed circuit voltage immediately before switching on one of the charging-side SOC-CCV characteristic and the discharging-side SOC-CCV characteristic, and passes near a second point, which is a point of the same remaining capacity on the other of the SOC-CCV characteristics, by an amount of change in remaining capacity required for polarization to reverse and enter a saturated state from the second point, the other of the SOC-CCV characteristics, when charging and discharging of the battery have been switched in the generating of the transient characteristic, wherein the transient characteristic is directed, at the third point, in a direction of a vector which is directed from the second point to the third point.

2. The method for estimating a remaining capacity of a battery according to claim 1, the method comprising:
storing polarization reverse amount of change map data that associates an amount of change in remaining capacity required for the polarization to reverse and enter a saturated state with a remaining capacity when charging and discharging of the battery have been switched; and
identifying an amount of change in a remaining capacity required for the polarization to reverse and enter a saturated state by referring to the polarization reverse amount of change map data from a remaining capacity when charging and discharging of the battery have been switched.

3. The method for estimating a remaining capacity of a battery according to claim 1, the method comprising:
generating a transient characteristic that is linear from the first point of the remaining capacity and the closed circuit voltage immediately before the switching to a point with the same remaining capacity as the remaining capacity of the first point and that is on an SOC-OCV characteristic representing a correlation between the remaining capacity of the battery and the open circuit voltage of the battery.

4. The method for estimating a remaining capacity of a battery according to claim 2, the method comprising:
generating a transient characteristic that is linear from the first point of the remaining capacity and the closed circuit voltage immediately before the switching to a point with the same remaining capacity as the remaining capacity of the first point and that is on an SOC-OCV characteristic representing a correlation between the remaining capacity of the battery and the open circuit voltage of the battery.

5. A device for estimating a remaining capacity of a battery, the device comprising:
an SOC-CCV map data storage that stores a SOC-CCV map data of a charging-side SOC-CCV characteristic that represents a correlation between a remaining capacity (SOC) of the battery and a Closed Circuit Voltage (CCV) of the battery when charging has only been conducted from a fully-discharged state to a fully-charged state and of a discharging-side SOC-CCV characteristic that represents a correlation between a remaining capacity of the battery and a closed circuit voltage of the battery when discharging has only been conducted from a fully-charged state to a fully-discharged state;
a transient characteristic generator that generates a transient characteristic that represents a correlation between a remaining capacity and a closed circuit voltage, the correlation transitioning from one of a charging-side SOC-CCV characteristic and a discharging-side SOC-CCV characteristic to the other on the basis of the SOC-CCV map data when charging and discharging of the battery have been switched; and
a remaining capacity estimator that estimates the remaining capacity of the battery from the closed circuit voltage by using the transient characteristic until polarization of the battery enters a saturated state when charging and discharging of the battery have been switched,
wherein
the transient characteristic generator generates a transient characteristic that contacts, at a third point, which is a point that has moved from a first point of a remaining capacity and a closed circuit voltage immediately before switching on one of the charging-side SOC-CCV characteristic and the discharging-side SOC-CCV characteristic, and passes near a second point, which is a point of the same remaining capacity on the other of the SOC-CCV characteristics, by an amount of change in remaining capacity required for polarization to reverse and enter a saturated state from the second point, the other of the SOC-CCV characteristics in a case when charging and discharging of the battery have been switched, wherein the transient characteristic is directed, at the third point, in a direction of a vector which is directed from the second point to the third point.

6. The device for estimating a remaining capacity of a battery according to claim 5, the device comprising:
a polarization-reverse amount-of-change map-data storage that stores a polarization reverse amount of change map data that associates an amount of change in a remaining capacity required for the polarization to reverse and enter a saturated state with a remaining capacity when charging and discharging of the battery have been switched, wherein
the transient characteristic generator identifies an amount of change in a remaining capacity required for the polarization to reverse and enter a saturated state by referring to the polarization reverse amount of change map data from a remaining capacity when charging and discharging of the battery have been switched.

7. The device for estimating a remaining capacity of a battery according to claim 5, wherein
the transient characteristic generator generates a transient characteristic that is linear from the first point of the remaining capacity and the closed circuit voltage immediately before the switching to a point that is a point with the same remaining capacity as the remaining capacity of the first point and that is on an SOC-OCV characteristic representing a correlation between the remaining capacity of the battery and the open circuit voltage of the battery.

8. The device for estimating a remaining capacity of a battery according to claim 6, wherein
the transient characteristic generator generates a transient characteristic that is linear from the first point of the remaining capacity and the closed circuit voltage immediately before the switching to a point with the same remaining capacity as the remaining capacity of the first point and that is on an SOC-OCV characteristic representing a correlation between the remaining capacity of the battery and the open circuit voltage of the battery.

* * * * *